• US008735908B2

(12) United States Patent
Shimada

(10) Patent No.: US 8,735,908 B2
(45) Date of Patent: May 27, 2014

(54) SEMICONDUCTOR DEVICE, ELECTRO-OPTIC DEVICE, POWER CONVERSION DEVICE, AND ELECTRONIC APPARATUS

(75) Inventor: Hiroyuki Shimada, Chuo (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 13/563,241

(22) Filed: Jul. 31, 2012

(65) Prior Publication Data

US 2013/0049013 A1 Feb. 28, 2013

(30) Foreign Application Priority Data

Aug. 23, 2011 (JP) ................. 2011-181405

(51) Int. Cl.
*H01L 29/15* (2006.01)
*H01L 21/20* (2006.01)

(52) U.S. Cl.
USPC .......................................... 257/77; 438/481

(58) Field of Classification Search
USPC ................ 257/77, 615; 438/481, 604, 479
See application file for complete search history.

(56) References Cited

U.S. PATENT DOCUMENTS

| 5,279,701 A | 1/1994 | Shigeta et al. | |
|---|---|---|---|
| 2004/0192043 A1* | 9/2004 | Makita et al. | 438/689 |
| 2005/0269645 A1* | 12/2005 | Kato | 257/371 |
| 2008/0257409 A1* | 10/2008 | Li et al. | 136/259 |

FOREIGN PATENT DOCUMENTS

| JP | A-6-41400 | 6/1994 |
|---|---|---|
| JP | B2-6-41400 | 6/1994 |
| JP | A-11-181567 | 7/1999 |

\* cited by examiner

*Primary Examiner* — Julio J Maldonado
*Assistant Examiner* — Moin Rahman
(74) *Attorney, Agent, or Firm* — Oliff PLC

(57) ABSTRACT

A semiconductor device includes a silicon substrate, a silicon carbide film formed on the silicon substrate, a mask member formed on a surface of the silicon carbide film, and having an opening section, single-crystal silicon carbide films each having grown epitaxially from the silicon carbide film exposed in the opening section as a base point, and covering the silicon carbide film and the mask member, and a semiconductor element formed on surfaces of the single-crystal silicon carbide films, an assembly section formed of the single-crystal silicon carbide films assembled to each other exists above the mask member, the semiconductor element has a body contact region, and the body contact region is disposed at a position overlapping the assembly section viewed from a direction perpendicular to the surface of the silicon substrate.

16 Claims, 7 Drawing Sheets

SEMICONDUCTOR DEVICE, ELECTRO-OPTIC DEVICE, POWER CONVERSION DEVICE, AND ELECTRONIC APPARATUS

BACKGROUND

1. Technical Field

The present invention relates to a semiconductor device, an electro-optic device, a power conversion device, and an electronic apparatus.

2. Related Art

Single-crystal silicon is large in size, high in quality, and low in price, and has been used as a base on which a single crystal of a variety of materials is grown.

Among these materials, cubic silicon carbide (3C-SiC), which is a wide-bandgap semiconductor material having a band gap as high as 2.2 eV (300 K), is promising as a low-loss semiconductor material for power device in the next generation, and is thought to be extremely useful also from a viewpoint in particular that it can be grown as a film or a single crystal (heteroepitaxy) on a low-price silicon substrate.

Incidentally, the lattice parameter of cubic silicon carbide is 0.436 nm, which is as smaller as roughly 20% than the lattice parameter (0.543 nm) of cubic silicon. Further, there is a difference of roughly 8% in thermal expansion coefficient between cubic silicon carbide and cubic silicon. Therefore, a lot of voids and misfit dislocations are apt to occur in the cubic silicon carbide grown as a single crystal, and it has been difficult to obtain a high-quality epitaxial film with little crystal defects.

The technology for solving such a problem has been studied, and in JP-A-11-181567, for example, a mask layer is formed on a surface of a substrate in which silicon carbide is grown, then an opening section is formed in the mask layer to thereby disclose the surface of the substrate on which epitaxial growth of single-crystal silicon carbide is performed, wherein the height of the opening section is set to be equal to or higher than $2^{1/2}$ of the width of the opening section, and at the same time to a height exceeding the thickness of the single-crystal silicon carbide to be formed.

However, right above the mask layer there exist defects (coalesced defects) in an assembled portion formed of the single-crystal silicon carbide films assembled to each other. Therefore, when forming a semiconductor element on the surface of the single-crystal silicon carbide film, there is a case in which a depletion layer formed in the vicinity of the source region or the drain region of the semiconductor element traverses the coalesced defects. As a result, there is a problem that the leakage current increases to thereby degrade the device characteristics.

SUMMARY

An advantage of some aspects of the invention is to provide a semiconductor device, an electro-optic device, and an electronic apparatus each capable of suppressing the degradation of the device characteristics.

An aspect of the invention is directed to a semiconductor device including a substrate including silicon, a first silicon carbide film disposed on a surface of the silicon, a mask member disposed on a surface of the first silicon carbide film, and a second silicon carbide film adapted to cover the first silicon carbide film in an opening section of the mask member and the mask member, wherein a semiconductor element including at least a part of the second silicon carbide film includes a body contact region, and the body contact region includes an coalesced defect of the second silicon carbide film.

The body contact region denotes an impurity region for fixing the potential of the body region formed below the body contact region. The body contact region is a region hardly affecting the device characteristics. According to the present configuration, since the body contact region of the semiconductor element is disposed at a position overlapping the assembly section having the coalesced defect in the plan view, the source region and the drain region of the semiconductor element are disposed at positions not overlapping the assembly section in the plan view. In other words, it results that the regions significantly affecting the device characteristics such as the source regions and the drain regions are disposed at the positions not overlapping the assembly section. Thus, the depletion layer formed in the vicinity of the source region and the drain region is also disposed at a position not overlapping the assembly section in the plan view. Therefore, the depletion layer can be prevented from traversing the assembly section. Therefore, the leakage current can be prevented from occurring. Therefore, it becomes possible to prevent the device characteristics from being deteriorated.

The second silicon carbide film may be one having grown epitaxially based on the first silicon carbide film in the opening section of the mask member.

The semiconductor device according to the aspect of the invention may be configured such that the semiconductor element further includes a transistor region including a source region, a drain region, and a gate region, the source region is disposed between the body contact region and the drain region, and the coalesced defect is disposed in a region except the transistor region.

According to this configuration, since the source region, the source electrodes, the drain region, the drain electrodes, the gate region, and the gate electrodes of the semiconductor elements are disposed at the positions not overlapping the assembly section having the coalesced defect in the plan view, it results that the depletion layers formed in the regions overlapping the source electrodes, the drain electrodes, or the gate electrodes in the plan view are also disposed at the positions not overlapping the assembly section in the plan view. Therefore, the depletion layer can be prevented from traversing the assembly section in a wide range. Therefore, it becomes possible to reduce the leakage current in a wide range.

The semiconductor device according to this aspect of the invention may be configured such that the mask member extends in a first direction viewed from a direction intersecting with the surface of the first silicon carbide film, the coalesced defect is disposed along the first direction, the body contact region extends in the first direction, and the source region, the drain region, and the gate region are disposed along the body contact region.

According to the configuration described above, since the body contact region, the source region, the source electrode, the drain region, the drain electrode, the gate region, and the gate electrode of the semiconductor element are formed to have linear shapes parallel to each other in the plan view, a high-density device structure can be realized. Thus, the configuration of arranging the plurality of semiconductor elements in parallel to each other can be adopted. In this case, the sum of the lengths (hereinafter referred to as finger lengths) of the upper parts of the active regions of the gate electrodes corresponds to the channel width. Therefore, by arranging the plurality of gate electrodes in parallel to each other per unit area, the channel width per unit area can be increased. Therefore, it is possible to realize the semiconductor device capable of preventing the degradation of the device characteristics, and at the same time, allowing a lot of current to flow with the small device area.

The semiconductor device according to this aspect of the invention may be configured such that the second silicon carbide film is a cubic silicon carbide film.

According to this configuration, in the configuration in which the semiconductor elements are formed on the surface of the cubic silicon carbide film, it is possible to realize the semiconductor device capable of preventing the degradation of the device characteristics.

Another aspect of the invention is directed to an electro-optic device including the semiconductor device according to the above aspect of the invention.

According to this configuration, it is possible to provide an electro-optic device superior in reliability with leakage current reduced.

Still another aspect of the invention is directed to a power conversion device including the semiconductor device according to the above aspect of the invention.

According to this configuration, it is possible to provide a power conversion device superior in reliability with leakage current reduced.

Yet another aspect of the invention is directed to an electronic apparatus including the electro-optic device of the above aspect of the invention.

According to this configuration, it is possible to provide an electronic apparatus superior in reliability with degradation of the device characteristics prevented.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, some embodiments of the invention will be described with reference to the accompanying drawings. The embodiments each show an aspect of the invention, but do not limit the scope of the invention, and can arbitrarily be modified within the technical concept of the invention. Further, in order for making each of the constituents easy to understand, the drawings explained hereinafter are different in scale size, number, and so on from the actual structures.

Figure 1:
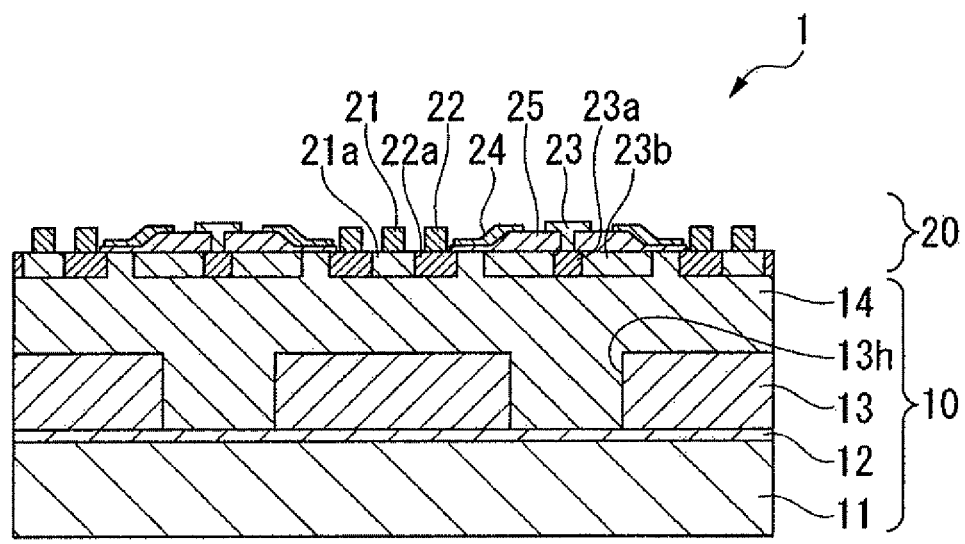
FIG. 1 is a cross-sectional view showing a semiconductor device according to an embodiment of the invention.

FIG. 1 is a cross-sectional view showing a semiconductor device according to an embodiment of the invention. It should be noted that in the present embodiment the explanation will be presented citing the configuration of the N-channel metal oxide semiconductor field effect transistor (MOSFET) as an example of that of the semiconductor device 1.

As shown in FIG. 1, the semiconductor device 1 is provided with a single-crystal silicon carbide film-attached substrate 10, and semiconductor elements 20 formed on the single-crystal silicon carbide film-attached substrate 10.

The single-crystal silicon carbide film-attached substrate 10 is provided with a silicon substrate 11, a silicon carbide film 12 formed on the surface of the silicon substrate 11, a mask member 13 having opening sections 13h and formed on the surface of the silicon carbide film 12, and a single-crystal silicon carbide film 14 epitaxially grown from the silicon carbide film 12 exposed from the opening sections 13h as base points, and covering the silicon carbide film 12 and the mask member 13.

The silicon substrate 11 is a substrate formed by, for example, slicing a silicon single crystal ingot pulled using a Czochralski method (CZ method), and then polishing it. The surface of the silicon substrate 11 forms a crystal plane represented by the Miller index of (100). It should be noted that it is also possible to use an offset substrate with the axis of the crystal plane tilted several degrees.

It should be noted that although in the present embodiment a silicon single crystal substrate is used as the silicon substrate 11, the silicon substrate 11 is not limited thereto. What is obtained by forming a single-crystal silicon film on a substrate made of, for example, quartz, sapphire, or stainless steel can also be adopted. In the present specification, the silicon single crystal substrate, or what is obtained by forming a single-crystal silicon film on a substrate made of, for example, quartz, sapphire, or stainless steel is referred to as a silicon substrate. The lattice parameter of such a single-crystal silicon is 0.543 nm.

The silicon carbide film 12 (a first silicon carbide film) is formed on the surface of the silicon substrate 11. The silicon carbide film 12 is formed of a single-crystal layer or a polycrystalline layer of silicon carbide (3C—SiC). The silicon carbide film 12 can be obtained by performing a carbonization process on the surface of the silicon substrate 11, and have a function of preventing silicon from sublimating from the surface of the silicon substrate 11 when forming the single-crystal silicon carbide film 14, and at the same time reducing the lattice mismatch between the silicon substrate 11 and the single-crystal silicon carbide film 14 to thereby prevent the dislocation defects from occurring in the single-crystal silicon carbide film 14. The silicon carbide film 12 is required to be formed to have a thickness corresponding to at least one atomic layer, and is set to have a thickness, for example, no lower than 2 nm and no higher than 30 nm.

The mask member 13 is formed on the surface of the silicon carbide film 12. The mask member 13 is provided with a plurality of opening sections 13h for exposing the surface of the silicon carbide film 12. The mask member 13 is configured including, for example, silicon oxide ($SiO_2$). It should be noted that the mask member 13 can also be configured including silicon nitride or aluminum oxide.

The single-crystal silicon carbide film 14 (a second silicon carbide film) is formed so as to cover the silicon carbide film 12 exposed from the opening sections 13h and the mask member 13. The single-crystal silicon carbide film 14 is a semiconductor film formed of cubic silicon carbide (3C—SiC) grown epitaxially. Since 3C—SiC has a bandgap value as wide as 2.2 eV or more, and has high thermal conductivity and breakdown electric field, 3C—SiC is preferable for wide-bandgap semiconductor for power devices. The lattice parameter of the single-crystal silicon carbide film 14 made of such 3C—SiC is 0.436 nm.

The semiconductor elements 20 are each provided with a body contact region 21, a source electrode 22 formed contiguously to the body contact region 21, a drain electrode 23 formed on the opposite side of the source electrode 22 to the body contact region 21, a gate electrode 24 formed between the source electrode 22 and the drain electrode 23, and a gate insulating film 25 formed between the single-crystal silicon carbide film 14 and the gate electrode 24.

In the single-crystal silicon carbide film 14, a body region 21a is formed below the body contact region 21. P-type impurities, for example, are introduced into the single-crystal silicon carbide film 14. P-type impurities, for example, are introduced into the body region 21a. Here, the "body contact region 21" denotes an impurity region for fixing the electrical potential of the body region 21a. The body contact region 21 is a region hardly affecting the device characteristics. The impurities of the same conductivity type as the body region 21a (e.g., P-type impurities) are introduced into the body contact region 21.

In the single-crystal silicon carbide film 14, a source region 22a is formed below the source electrode 22. N-type impurities, for example, are introduced into the source region 22a.

In the single-crystal silicon carbide film 14, below the drain electrode 23, there are formed a high-concentration drain region 23a and a low-concentration drain region 23b. N-type impurities, for example, are introduced into the high-concentration drain region 23a and the low-concentration drain region 23b. The low-concentration drain region 23b is a region formed to have an impurity concentration lower than that of the high-concentration drain region 23a. As described above, the semiconductor 1 is arranged to have a so-called lightly-doped drain (LDD) structure.

In the present embodiment, the semiconductor elements 20 are each provided with a $P^+$-type body contact region 21, a $P^+$-type body region 21a, an $N^+$-type source region 22a, an $N^+$-type high-concentration drain region 23a, and an $N^-$-type low-concentration drain region 23b.

The gate insulating film 25 has a relatively greater thickness in the part overlapping the drain electrode 23 and the part of the gate electrode 24 near to the drain electrode 23 in the plan view (viewed from a direction perpendicular to the surface of the silicon substrate 11). The gate insulating film 25 has a relatively smaller thickness in the part overlapping the part of the gate electrode 24 opposite to the drain electrode 23 in the plan view. Thus, a high withstand voltage property of the semiconductor elements 20 can be achieved.

The gate electrode 24 is formed on the gate insulating film 25. The gate electrode 24 is formed in the state of having a step corresponding to the shape of the step of the gate insulating film 25.

Figure 2:
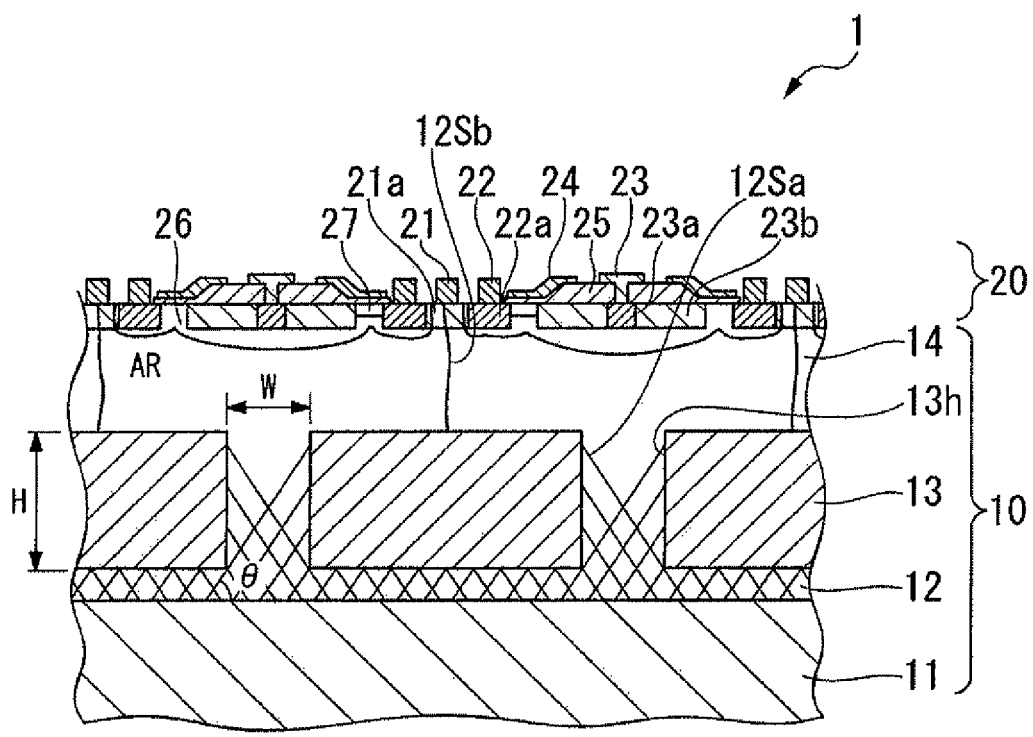
FIG. 2 is a cross-sectional view of a substantial part of the semiconductor device according to the embodiment.

FIG. 2 is a cross-sectional view of a substantial part of the semiconductor device. In FIG. 2, the reference symbol H denotes the height of the mask member 13, the reference symbol W denotes the width of the opening section 13h of the mask member 13, the symbol AR denotes a defect-free region, the reference symbol 12Sa denotes a stacking fault (a plane fault), the reference symbol 12Sb denotes an coalesced defect (an assembly section), and the reference symbol θ denotes an angle formed between the surface of the silicon substrate 11 and the plane fault 12Sa.

Here, the height H of the mask member 13 denotes the length (the distance between the upper surface and the lower surface of the mask member 13) of the mask member 13 in a direction perpendicular to the surface of the silicon substrate 11. The width W of the opening section 13h denotes the length (the distance between sidewalls of the mask member 13 opposed to each other across the opening section 13h) of the opening section 13h in a direction parallel to the surface of the silicon substrate 11.

As shown in FIG. 2, in the semiconductor device 1 according to the present embodiment, the coalesced defect 12Sb formed by the single-crystal silicon carbide films 14 assembled to each other exists right above the mask member 13. However, in the single-crystal silicon carbide film 14, the region except the coalesced defect 12Sb includes no crystal defect, and forms the defect-free region AR.

Such a defect-free region AR is formed if a predetermined relationship between the height H of the mask member 13 and the width W of the opening section 13h is fulfilled. In the present embodiment, the height H of the mask member 13 is arranged to be equal to or higher than $\sqrt{2}$ times of the width W of the opening section 13h. For example, the height H of the mask member 13 is 1.5 μm, and the width W of the opening section 13h is 1 μm. It should be noted that the angle θ formed between the surface of the silicon substrate 11 and the plane fault 12Sa is 54.7°.

The semiconductor device 1 according to the present embodiment is an N-channel MOSFET. Hereinafter, an operation principle of the N-channel MOSFET will be explained with reference to FIG. 2.

When, for example, applying a positive voltage to the drain electrode 23, a reverse voltage is applied to the P-N junction (a boundary area between the P-type region and the N-type region), and therefore, a depletion layer 26 shown in FIG. 2 is formed. When applying a positive voltage to the gate electrode 24, electrons are collected in the depletion layer 26 immediately below the gate electrode 24 to thereby form an N-type channel region 27. Thus, it is arranged that an electric current flows between the drain region 23b and the source region 22a.

Incidentally, when forming a semiconductor element on the surface of the single-crystal silicon carbide film, there is a case in which a depletion layer formed in the vicinity of the source region or the drain region of the semiconductor element traverses the coalesced defect. As a result, there has been a problem that the leakage current increases to thereby degrade the device characteristics.

Therefore, in invention, the body contact region 21 of each of the semiconductor elements 20 is located at the position overlapping the coalesced defect 12Sb in the plan view. Thus, it is arranged that the source region 22a and the drain regions 23a, 23b of each of the semiconductor elements 20 are disposed at positions not overlapping the coalesced defect 12Sb in the plan view.

In the present embodiment, at the position overlapping the coalesced defect 12Sb in the plan view, there is formed the body contact region 21 and the body region 21a alone. The source electrode 22, the drain electrode 23, the gate electrode 24, and the gate insulating film 25 are formed at positions not overlapping the coalesced defect 12Sb in the plan view.

Figure 3:
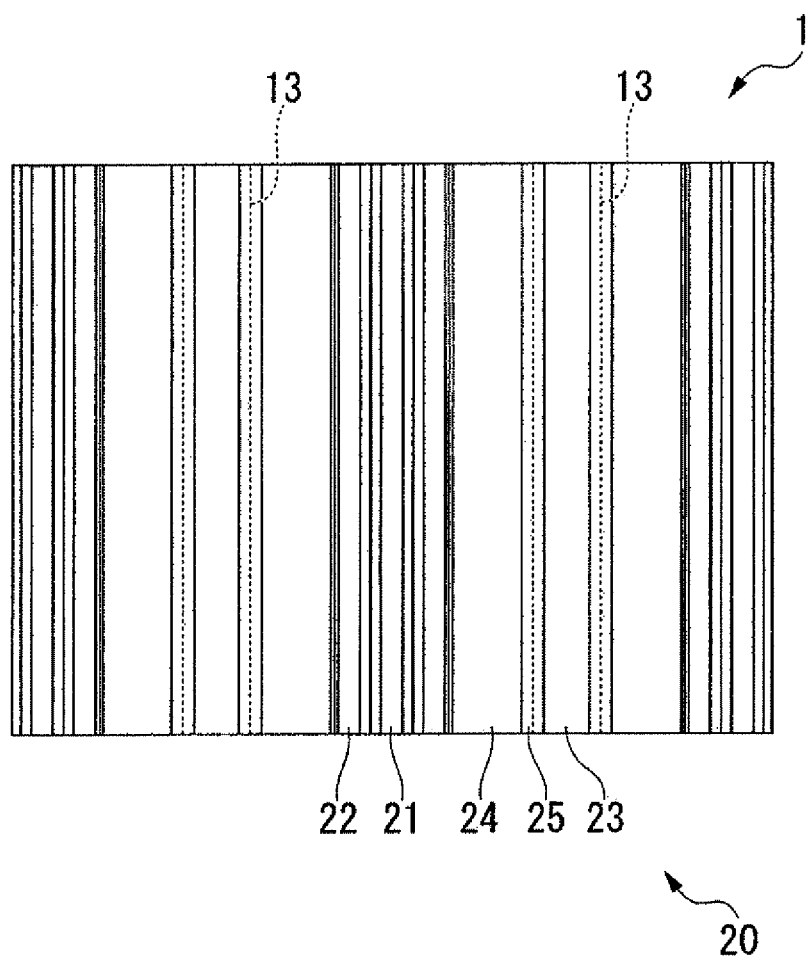
FIG. 3 is a plan view of the substantial part of the semiconductor device according to the embodiment.

FIG. 3 is a plan view of a substantial part of the semiconductor device.

As shown in FIG. 3, the mask members 13 are each formed to have a linear shape in the plan view. It should be noted that although not shown the coalesced defect 12Sb is formed along the extending direction of the mask member 13.

The body contact region 21 is formed to have a linear shape so as to overlap the coalesced defect 12Sb in the plan view. The source electrode 22, the drain electrode 23, and the gate electrode 24 are each formed to have a linear shape in parallel to the body contact region 21. The semiconductor device 1 according to the present embodiment has a so-called finger gate structure in which the semiconductor elements 20 have a high-density element configuration.

Method of Manufacturing Semiconductor Device

FIGS. 4A through 4D, 5A through 5D, and 6A through 6D are process charts showing a method of manufacturing the semiconductor device according to the present embodiment. It should be noted that in the explanation below, the temperature of the silicon substrate 11 is simply referred to as "substrate temperature" in some cases.

Figure 4A:
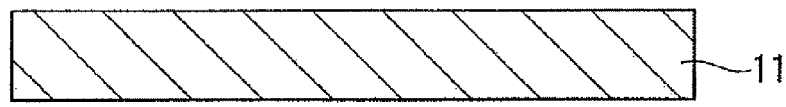
FIGS. 4A through 4D are process charts showing a method of manufacturing the semiconductor device according to the embodiment.

Firstly, the silicon substrate 11 is prepared, and then the silicon substrate 11 having been washed is housed in a chamber (not shown) of a chemical vapor deposition (CVD) device for epitaxial growth (see FIG. 4A).

Then, vacuum atmosphere is created in the chamber, while keeping the substrate temperature at roughly 600° C., monomethylsilane gas ($SiH_3CH_3$) is introduced at supply pressure of $1.0 \times 10^{-2}$ Pa, and then the silicon substrate is heated to roughly 1050° C. in that state to thereby perform a heat treatment in the condition of the process time of 120 minutes. Here, roughly 600° C. denotes the temperature in a temperature range including the setting error of the substrate temperature, and in a range, for example, no lower than 590° C. and no higher than 610° C. Further, roughly 1050° C. denotes the temperature in a temperature range including the setting error of the substrate temperature, and in a range, for example, no lower than 1040° C. and no higher than 1060° C.

Figure 4B:

By the heat treatment, the silicon carbide film 12 having a thickness of about 200 nm on the surface of the silicon substrate 11 (a first process, see FIG. 4B).

Figure 4C:
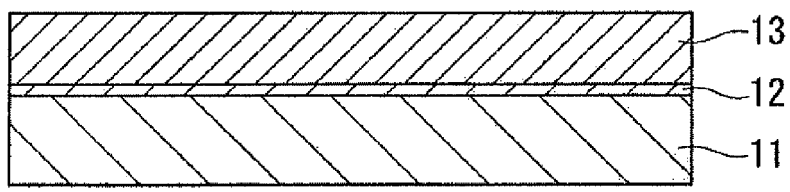

Then, the mask member 13 is formed on the surface of the silicon carbide film 12 (a second process, see FIG. 4C). Here, by stacking the silicon oxide film of about 1.5 μm on the surface of the silicon carbide film 12 using a high-density plasma CVD device, the mask member 13 is formed on the surface of the silicon carbide film 12.

Figure 4D:
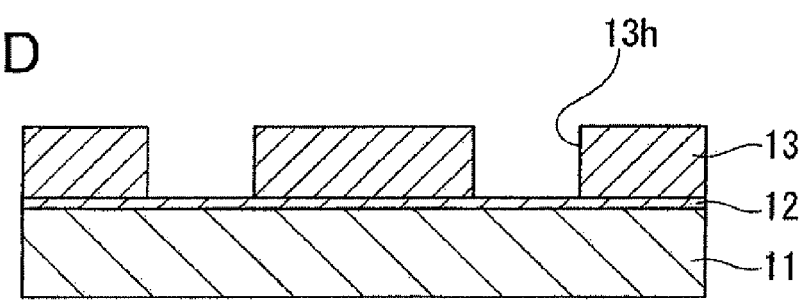

Then, the mask member 13 is patterned to form opening sections 13h to thereby partially expose the surface of the silicon carbide film 12 (a third process, see FIG. 4D). For example, a resist is applied on the mask member 13, and then the resist is patterned to a desired pattern, for example, a line-and-space pattern using a photolithography method. Using the resist thus patterned as the mask, etching is performed on the mask member 13.

Due to this process, it results that the mask member 13 is patterned to have a desired pattern shape, and it results that the surface of the silicon carbide film 12 is partially exposed in the opening sections 13h of the mask member 13. It should be noted that it is arranged that the width of the opening section 13h is about 1 μm, the width of the mask member 13 is about 5 μm, and the height (H=1.5 μm) of the mask member 13 is equal to or higher than √2 times of the width (W=1 μm) of the opening section 13h.

After partially exposing the surface of the silicon carbide film 12, monomethylsilane gas ($SiH_3CH_3$) is introduced alone into the chamber as a raw material gas, and the pressure of the gas atmosphere in the chamber is adjusted to $2.5 \times 10^{-3}$ Pa, and then the substrate temperature is dropped to roughly 1030° C. in that state.

It should be noted that the substrate temperature at this time is set to the temperature within the range no lower than 900° C. and no higher than 1100° C., and then the substrate temperature is kept.

Here, if the substrate temperature is lower than 900° C., carbonization of the surface of the silicon substrate 11 due to the raw material gas gets insufficient, and as a result, there undesirably arises the problem that the single-crystal silicon carbide film 14 with preferable crystalline state fails to be formed on the surface of the silicon carbide film 12. On the other hand, if the substrate temperature exceeds 1100° C., due to the relation with the fact that the pressure of the gas atmosphere is extremely low, there undesirably arises the problem that single-crystal silicon evaporates.

Further, the pressure of the gas atmosphere at this time is set to the pressure within a range no lower than $5.0 \times 10^{-4}$ Pa and no higher than 0.5 Pa, and then the pressure is kept.

Here, if the pressure of the gas atmosphere is lower than $5.0 \times 10^{-4}$ Pa, there undesirably arises the problem that the forming material of the silicon substrate 11 evaporates. On the other hand, if the pressure of the gas atmosphere exceeds 0.5 Pa, there undesirably arises the problem that a silicon carbide film is formed on the surface of the mask member 13, and a film including crystal defects grows from the silicon carbide film remaining on the surface of the mask layer as a base point.

Further, as the raw material gas introduced into the chamber, a mixed gas of a dichlorosilane gas ($SiH_2Cl_2$) and an ethylene gas ($C_2H_2$) can also be used. Further, besides the above, those obtained by mixing organic silane gases such as silicon tetrachloride, trichlorosilane ($SiHCl_3$), monosilane ($SiH_4$), or disilane ($Si_2H_6$) can also be used. Further, as a carrier gas of the raw material gas, argon, hydrogen, and the mixture of these gases can also be used.

Figure 5A:
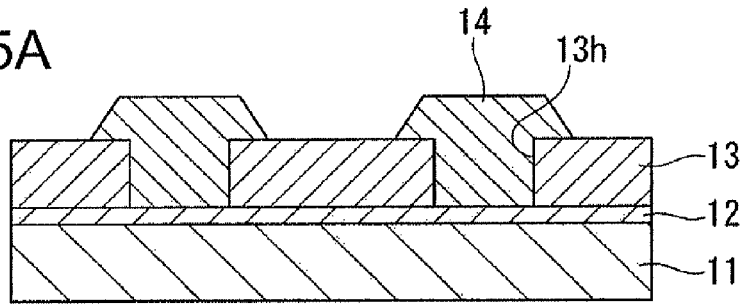
FIGS. 5A through 5D are process charts subsequent to FIG. 4D, and showing the method of manufacturing the semiconductor device according to the embodiment.

By the present process, single-crystal silicon carbide is grown epitaxially from the parts of the silicon carbide film 12 exposed from the opening sections 13h as the base points to thereby form the single-crystal silicon carbide films 14 covering the silicon carbide film 12 exposed from the opening sections 13h and the mask member 13 (a fourth process, see FIG. 5A).

The surface of the mask member 13 is covered by single-crystal silicon carbide growing from the parts of the silicon carbide film 12 exposed from the opening sections 13h as the base points in respective directions from the opening sections 13h toward the areas above the mask members 13. In other words, in the area above each of the mask members 13, an epitaxial lateral overgrowth (ELO) state is created.

Figure 5B:
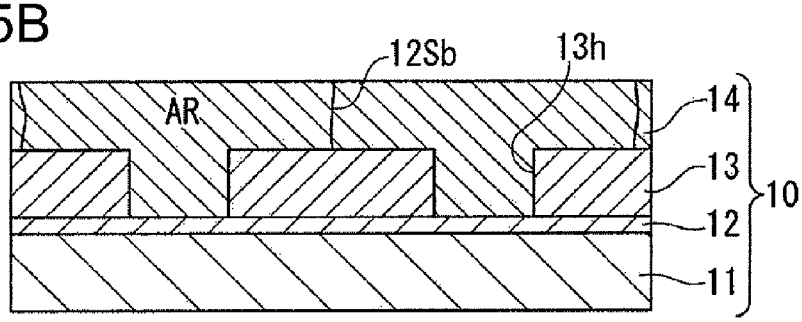

By the present process, the single-crystal silicon carbide films 14 with no stacking fault are formed on the surface of each of the mask members 13 (see FIG. 5B). It should be noted that right above the roughly central portion of each of the mask members 13 there exists the coalesced defect formed of the single-crystal silicon carbide films 14 assembled to each other. However, in each of the single-crystal silicon carbide films 14, the region except the coalesced defect 12Sb includes no crystal fault, and forms the defect-free region AR.

The substrate 10 attached with the single-crystal silicon carbide film can be obtained through the processes described above.

Then, the semiconductor elements 20 are formed on the substrate 10 attached with the single-crystal silicon carbide film.

Figure 5C:
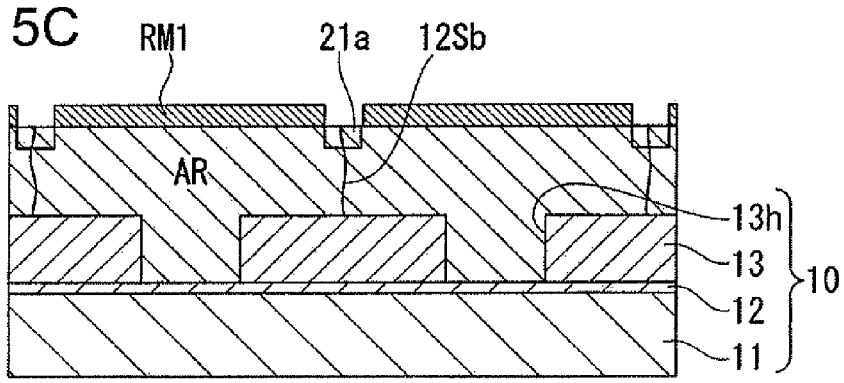

Specifically, the body regions 21a are formed on the single-crystal silicon carbide films 14 at the position overlapping the respective coalesced defects 12Sb in the plan view (see FIG. 5C). In this process, openings are provided to, for example, a resist mask RM1 at positions where the body regions 21a are to be formed, and then impurities with a predetermined conductivity type are injected into the single-crystal silicon carbide films 14 by an ion injection method using the resist mask RM1 as the mask.

Figure 5D:
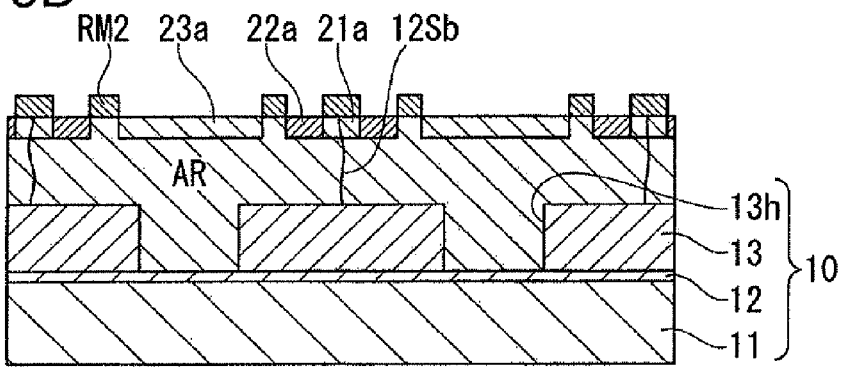

Then, the source regions 22a are formed at the positions adjacent to the respective body regions 21a, and at the same time, the drain regions 23b are formed on the opposite side of the respective source regions 22a to the respective body regions 21a (see FIG. 5D). In this process, openings are provided to, for example, a resist mask RM2 at positions where the respective source regions 22a are to be formed and at the same time, openings are provided at positions where the respective drain regions 23b are to be formed, and then impurities with a predetermined conductivity type are injected into the single-crystal silicon carbide films 14 by an ion injection method using the resist mask RM2 as the mask.

Figure 6A:
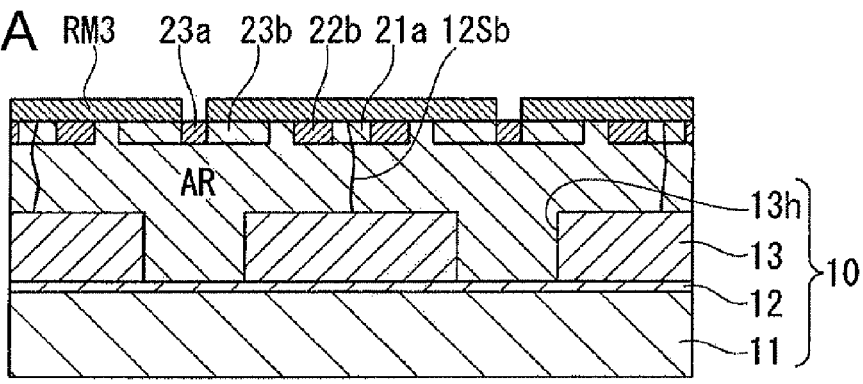
FIGS. 6A through 6D are process charts subsequent to FIG. 5D, and showing the method of manufacturing the semiconductor device according to the embodiment.

Then, the high-concentration drain regions 23a are formed at a roughly central portion of the respective drain regions 23b (see FIG. 6A). In this process, openings are provided to, for example, a resist mask RM3 at positions where the high-concentration drain regions 23a are to be formed, and then impurities with a predetermined conductivity type are injected into the respective drain regions 23b by an ion injection method using the resist mask RM3 as the mask. Thus, the LDD structure provided with the high-concentration drain region 23a and the low-concentration drain region 23b can be obtained.

On all of the regions on which the ion injection has been performed, activation annealing is performed using a laser annealing method. Thus, it is possible to instantaneously set the surface of each of the single-silicon carbide films 14 to a high temperature of about 1600° C. Therefore, it is possible to perform the activation annealing on the regions on which the ion injection has been performed while suppressing the substrate temperature to the temperature equal to or lower than the melting point (e.g., the melting point 1416° C. of the silicon substrate).

On the source regions 22a and the drain regions 23b on which the ion injection has been performed, activation annealing is performed using a laser annealing method. Thus, it is possible to instantaneously set the surface of each of the single-silicon carbide films 14 to a high temperature of about 1600° C. Therefore, it is possible to perform the activation annealing on the source regions 22a and the drain regions 23b while suppressing the substrate temperature to the temperature equal to or lower than the melting point (e.g., the melting point 1416° C. of the silicon substrate).

Figure 6B:
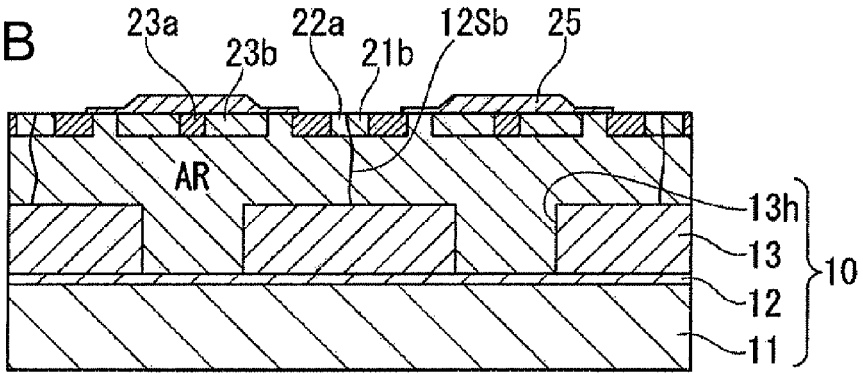

Then, the gate insulating film 25 is formed on each of the parts to be the drain regions 23a, 23b and the channel regions (see FIG. 6B). At this time, the gate insulating film 25 is formed so as to have a relatively greater thickness in the portion overlapping each of the drain electrodes 23 in the plan view. Specifically, the gate insulating film 25 is formed on each of the portions to be the drain regions 23a, 23b and the channel regions, and then etching is performed only on the region of the gate insulating film 25 overlapping each of the channel regions using the mask by using the photolithography method to thereby make it possible to form the gate insulating film 25 so as to have a relatively greater thickness in the portion overlapping each of the drain electrodes 23 in the plan view.

Figure 6C:
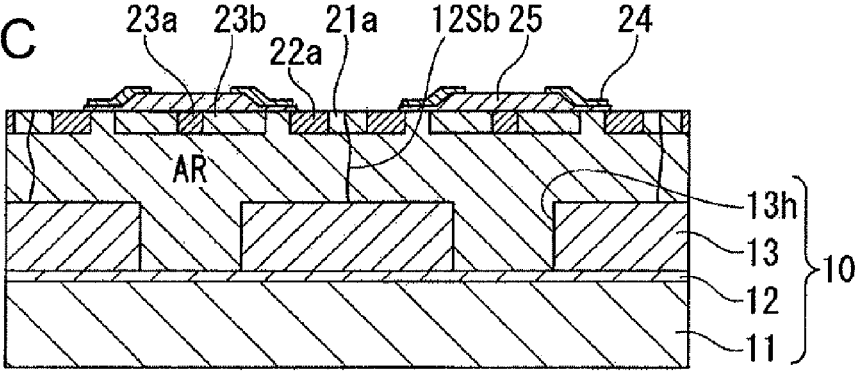

Then, the gate electrode 24 is formed on each of the gate insulating films 25 (see FIG. 6C). For example, the gate electrode 24 can be formed by forming a conductive layer on the entire surface of the gate insulating film 25, and then patterning the conductive layer.

Figure 6D:
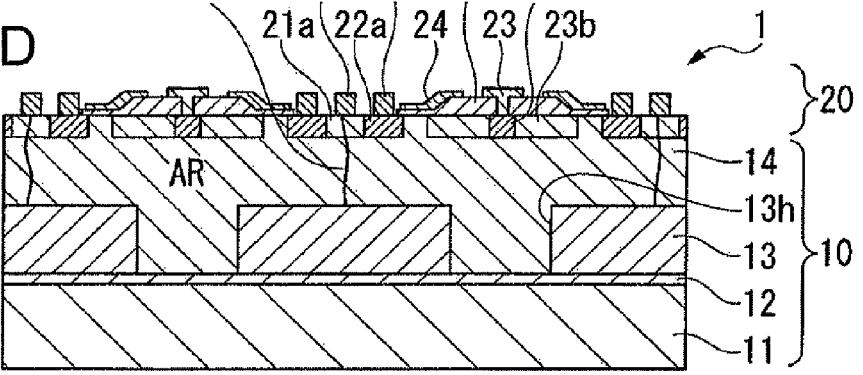

Subsequently, by going through the general wiring formation process including the source electrodes 22, the drain electrodes 23, and so on, it is possible to form the semiconductor elements 20 on the substrate 10 attached with the single-crystal silicon carbide film (see FIG. 6D).

The semiconductor device 1 according to the present embodiment can be manufactured by the processes described hereinabove.

According to the semiconductor device 1 of the present embodiment, since the body contact regions 21 of the semiconductor elements 20 are disposed at the positions overlapping the coalesced defects 12Sb in the plan view, the source regions 22a, and the drain regions 23a, 23b of the semiconductor elements 20 are disposed at the positions not overlapping the coalesced defects 12Sb in the plan view. In other words, it results that the regions significantly affecting the device characteristics such as the source regions 22a and the drain regions 23a, 23b are disposed at the positions not overlapping the coalesced defects 12Sb. Thus, the depletion layers 26 formed in the vicinity of the source regions 22a and the drain regions 23a, 23b are also disposed at positions not overlapping the coalesced defects 12Sb in the plan view. Therefore, the depletion layers 26 can be prevented from traversing the coalesced defects 12Sb. Therefore, the leakage current can be prevented from occurring. Therefore, it becomes possible to prevent the device characteristics from being deteriorated.

Further, according to this configuration, since the source electrodes 22, the drain electrodes 23, and the gate electrodes 24 of the semiconductor elements 20 are disposed at the positions not overlapping the coalesced defects 12Sb, it results that the depletion layers 26 formed in the regions overlapping the source electrodes 22, the drain electrodes 23, or the gate electrodes 24 in the plan view are also disposed at the positions not overlapping the coalesced defects 12Sb in the plan view. Therefore, the depletion layers 26 can be prevented from traversing the coalesced defects 12Sb in a wide range. Therefore, it becomes possible to reduce the leakage current in a wide range.

Further, according to the configuration described above, since the body contact regions 21, the source electrodes 22, the drain electrodes 23, and the gate electrodes 24 of the semiconductor elements 20 are formed to have linear shapes parallel to each other, a high-density device structure can be realized. Thus, the configuration of arranging the plurality of semiconductor elements 20 in parallel to each other can be adopted. In this case, the sum of the lengths (hereinafter referred to as finger lengths) of the upper parts of the active regions of the gate electrodes 24 corresponds to the channel width. Therefore, by arranging the plurality of gate electrodes 24 in parallel to each other per unit area, the channel width per unit area can be increased. Therefore, it is possible to realize the semiconductor device 1 capable of preventing the degradation of the device characteristics, and at the same time, allowing a lot of current to flow with the small device area.

Further, according to this configuration, in the configuration in which the semiconductor elements 20 are formed on the surface of the cubic silicon carbide film, it is possible to realize the semiconductor device 1 capable of preventing the degradation of the device characteristics.

Electro-Optic Device

Then, an electro-optic device equipped with the semiconductor device according to the embodiment described above will be explained.

Figure 7:
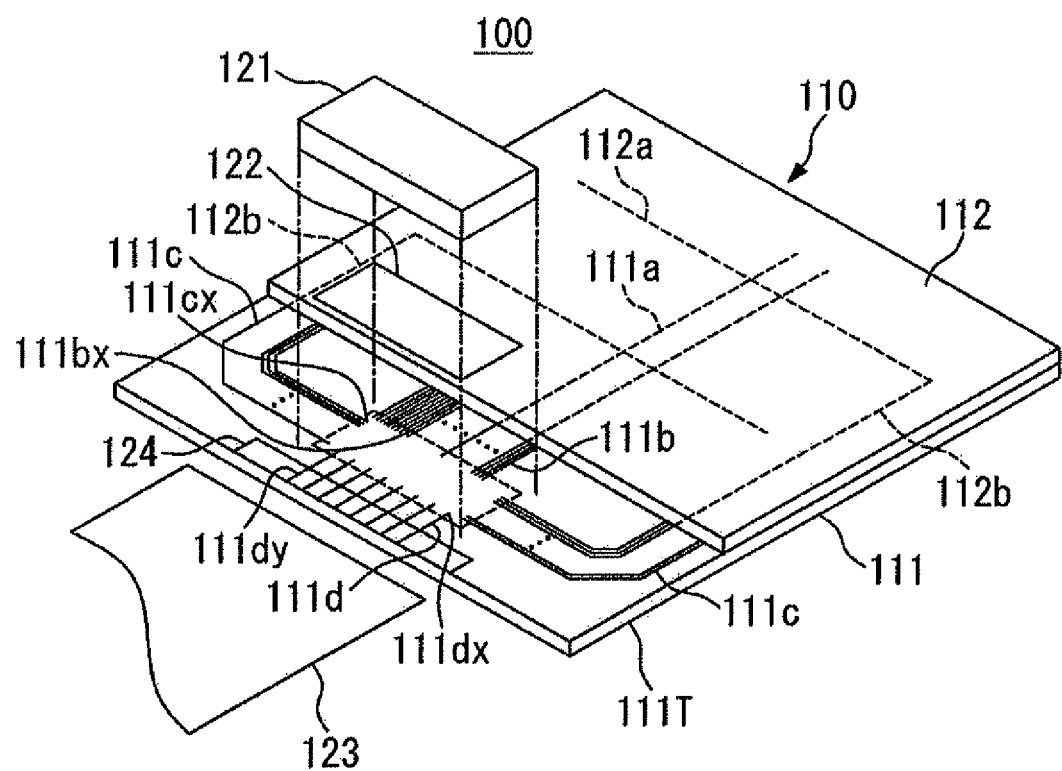
FIG. 7 is a schematic diagram showing a liquid crystal display device as an electro-optic device according to an embodiment of the invention.

FIG. 7 is a schematic diagram showing a liquid crystal display device as an electro-optic device according to an embodiment of the invention. The liquid crystal display device 100 shown in the drawing has a liquid crystal panel 110, and the semiconductor device 121 as a liquid crystal driving IC chip. Further, attendant members such as polarization plates, reflecting sheets, and a backlight not shown are appropriately disposed if necessary.

The liquid crystal panel 110 is provided with a substrates 111, 112 each formed of, for example, glass or resin. The substrates 111, 112 are disposed so as to face each other, and are bonded to each other with, for example, a seal member not shown. Between the substrates 111, 112, there is encapsulated the liquid crystal (not shown) as an electro-optic material. On the inner surface of the substrate 111, there are formed electrodes 111a each formed of a transparent conductive body such as indium tin oxide (ITO), and on the inner surface of the substrate 112, there are formed electrodes 112a disposed so as to face the electrodes 111a described above. It should be noted that the electrodes 111a and the electrodes 112a are disposed so as to be perpendicular to each other. Further, the electrodes 111a and the electrodes 112a are drawn to a substrate-flared portion 111T, and the end portions thereof are respectively provided with electrode terminals 111bx and electrode terminals 111cx. Further, in the vicinity of the edge of the substrate-flared portion 111T, there are formed input wiring lines 111d, and the inner ends thereof are also provided with terminals 111dx.

On the substrate-flared portion 111T, there is mounted the semiconductor device 121 via sealing resin 122 made of thermosetting resin in an uncured state or a semi-cured state. The semiconductor device 121 is, for example, a liquid crystal driving IC chip for driving the liquid crystal panel 110. On the lower surface of the semiconductor device 121, there are formed a number of resin bump electrodes not shown, these bumps are electrically connected to the terminals 111bx, 111cx, and 111dx on the substrate-flared portion 111T, respectively.

Further, on input terminals 111dy formed in the outer end portions of the input wiring lines 111d, there is mounted a flexible wiring board 123 via an anisotropic conductive film 124. The input terminals 111dy are electrically connected to wiring lines not shown provided to the flexible wiring board 123, respectively. Further, it is arranged that a control signal, a video signal, a power supply potential, and so on are externally supplied to the input terminals 111dy via the flexible wiring board 123, and drive signals for driving the liquid crystal are generated in the semiconductor device 121, and are then supplied to the liquid crystal panel 110.

According to the liquid crystal display device 100 of the present embodiment configured as described above, since the appropriate voltage is applied between the electrodes 111a and the electrodes 112a via the semiconductor device 121, it is possible to reorient the liquid crystal in the pixel parts where the both electrodes 111a, 112a are disposed so as to be opposed to each other to thereby modulate the light, and thus, it is possible to form a desired image in the display area where the pixels are arranged in the liquid crystal panel 110.

It should be noted that the electro-optic device equipped with the semiconductor device according to the embodiment described above is not limited to the liquid crystal display device described above, and the invention can also be applied to a plasma display panel (PDP).

Further, the device equipped with the semiconductor device according to the embodiment described above is not limited to the electro-optic device, and the invention can also be applied to a power conversion device. Specifically, as an application example to the power conversion device equipped with the semiconductor device according to the embodiment described above, there can be cited application examples to an AC-DC converter, a DC-DC converter, and an AC adapter of a personal computer.

Electronic Apparatus

Figure 8:
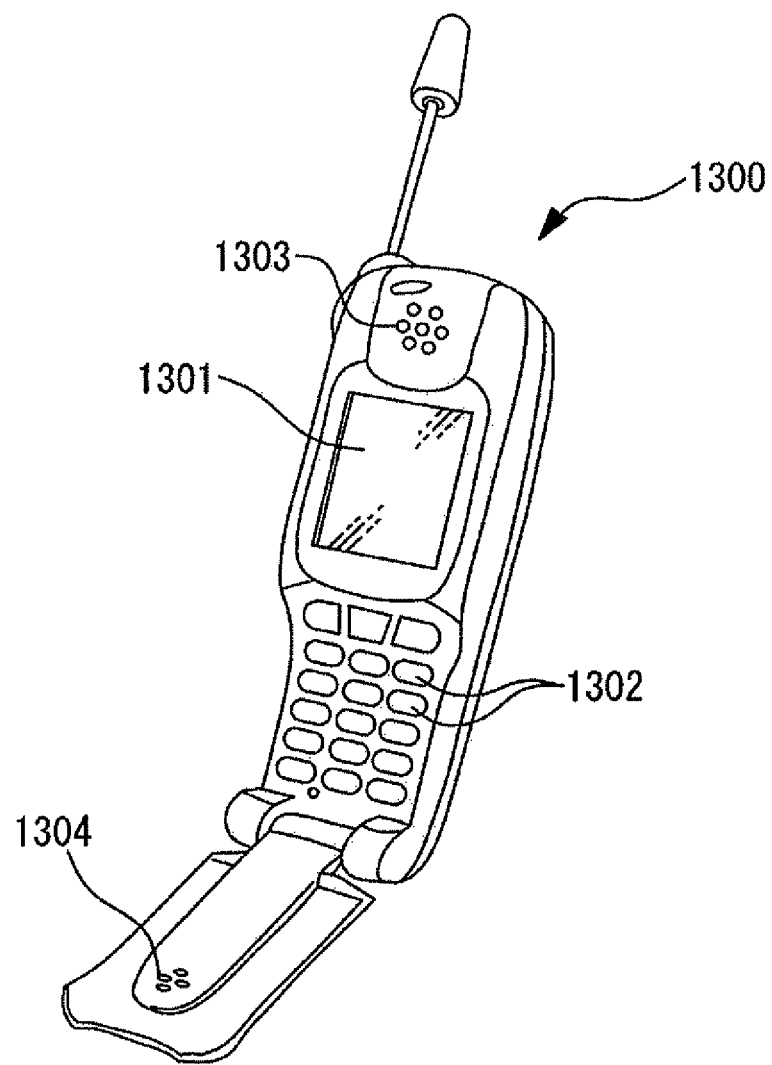
FIG. 8 is a perspective view showing an example of an electronic apparatus.

FIG. 8 is a perspective view showing an example of an electronic apparatus according to an embodiment of the invention. A cellular phone 1300 shown in the drawing is configured including the electro-optic device described above as a small-sized display section 1301, a plurality of operating buttons 1302, an ear piece 1303, and a mouthpiece 1304.

The electro-optic device described above is not limited to the cellular phone described above, but can preferably be used as an image display section of an electronic book, a personal computer, a digital still camera, a liquid crystal television, a video cassette recorder of either a view-finder type or a direct view type, a car navigation system, a pager, a personal digital assistance, an electronic calculator, a word processor, a workstation, a picture phone, a POS terminal, a device equipped with a touch panel, and so on, and a head-mount display (HMD), and in either of the cases, an electronic apparatus superior in reliability of electrical connection can be provided.

The entire disclosure of Japanese Patent Application No. 2011-181405, filed Aug. 23, 2011 is expressly incorporated by reference herein.

What is claimed is:

1. A semiconductor device comprising:
a substrate including silicon;
a first silicon carbide film disposed on a surface of the silicon;
a mask member disposed on a surface of the first silicon carbide film; and
a second silicon carbide film that covers the first silicon carbide film in an opening section of the mask member,
a semiconductor element including a source region, a drain region and a body contact region, the body contact region disposed adjacent to the source region, the body contact region having an opposite conductivity as a conductivity of the source region, at least a part of the second silicon carbide film including the body contact region, and
the body contact region including an coalesced defect of the second silicon carbide film, the coalesced defect being disposed in a portion of the second silicon carbide film directly below the body contact region, the second silicon carbide region including defect free regions on both sides of the coalesced defect.

2. The semiconductor device according to claim 1, the second silicon carbide film being grown epitaxially from the first silicon carbide film in the opening section of the mask member.

3. The semiconductor device according to claim 1, the mask member extending in a first direction viewed from a direction intersecting with a surface of the first silicon carbide film,
the coalesced defect being disposed along the first direction,
the body contact region extending in the first direction, and
the source region, the drain region, and a gate region being disposed along the body contact region.

4. The semiconductor device according to claim 1, a crystal structure of the second silicon carbide film including cubic structure.

5. An electro-optic device comprising:
the semiconductor device according to claim 1.

6. An electro-optic device comprising:
the semiconductor device according to claim 2.

7. An electro-optic device comprising:
the semiconductor device according to claim 3.

8. An electro-optic device comprising:
the semiconductor device according to claim 4.

9. A power conversion device comprising:
the semiconductor device according to claim 1.

10. A power conversion device comprising:
the semiconductor device according to claim 2.
11. A power conversion device comprising:
the semiconductor device according to claim 3.
12. A power conversion device comprising:
the semiconductor device according to claim 4.
13. An electronic apparatus comprising:
the electro-optic device according to claim 5.
14. An electronic apparatus comprising:
the electro-optic device according to claim 6.
15. An electronic apparatus comprising:
the power conversion device according to claim 9.
16. An electronic apparatus comprising:
the power conversion device according to claim 10.

\* \* \* \* \*